(12) United States Patent
Rossnagel

(10) Patent No.: US 6,342,132 B1
(45) Date of Patent: Jan. 29, 2002

(54) METHOD OF CONTROLLING GAS DENSITY IN AN IONIZED PHYSICAL VAPOR DEPOSITION APPARATUS

(75) Inventor: Stephen Mark Rossnagel, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/430,830

(22) Filed: Oct. 29, 1999

(51) Int. Cl.[7] .............................................. C23C 14/35
(52) U.S. Cl. ............................. 204/192.12; 204/192.13
(58) Field of Search ........................ 204/192.12, 192.13

(56) References Cited

U.S. PATENT DOCUMENTS

| | | | |
|---|---|---|---|
| 4,692,230 A | * 9/1987 | Nihei et al. ............. | 204/192.31 |
| 4,874,497 A | 10/1989 | Matsuoka et al. .......... | 204/298 |
| 4,941,915 A | 7/1990 | Matsuoka et al. ..... | 204/298.12 |
| 5,045,166 A | 9/1991 | Bobbio ................... | 204/192.32 |
| 5,178,739 A | * 1/1993 | Barnes et al. ........... | 204/192.12 |
| 5,277,752 A | 1/1994 | Aydil et al. ................. | 156/643 |
| 5,346,600 A | 9/1994 | Nieh et al. ............... | 204/192.3 |
| 5,368,685 A | 11/1994 | Kumihashi et al. .......... | 156/643 |
| 5,571,332 A | 11/1996 | Halpern ...................... | 118/723 |
| 5,693,238 A | 12/1997 | Schmitt et al. ................ | 216/67 |
| 5,702,530 A | 12/1997 | Shan et al. .................. | 118/723 |
| 5,702,573 A | 12/1997 | Bilberger et al. ....... | 204/192.12 |
| 5,763,017 A | 6/1998 | Ohkawa ..................... | 427/523 |
| 5,792,522 A | 8/1998 | Jin et al. .................... | 427/575 |

* cited by examiner

*Primary Examiner*—Nam Nguyen
*Assistant Examiner*—Steven H. VerSteeg
(74) *Attorney, Agent, or Firm*—Jay H. Anderson

(57) ABSTRACT

Gas rarefaction, and loss of ionization efficiency, resulting from magnetron sputtering in IPVD may be avoided by operating the magnetron in a pulsed fashion, rather than in a steady state, during the deposition process. The magnetron is powered during a first time period to produce a flux of atoms which heat the gas, and depowered during a second time period. The gas flows through the device during the powering step and the depowering step so as to prevent rarefaction of the gas by heating. The flow of gas through the device is characterized by a residence time. If the residence time is given as $\tau$, and the first time period and the second time period are substantially equal, the operation of the magnetron may be characterized by a frequency of $1/\tau$. The second time period may be greater than the first time period.

5 Claims, 3 Drawing Sheets

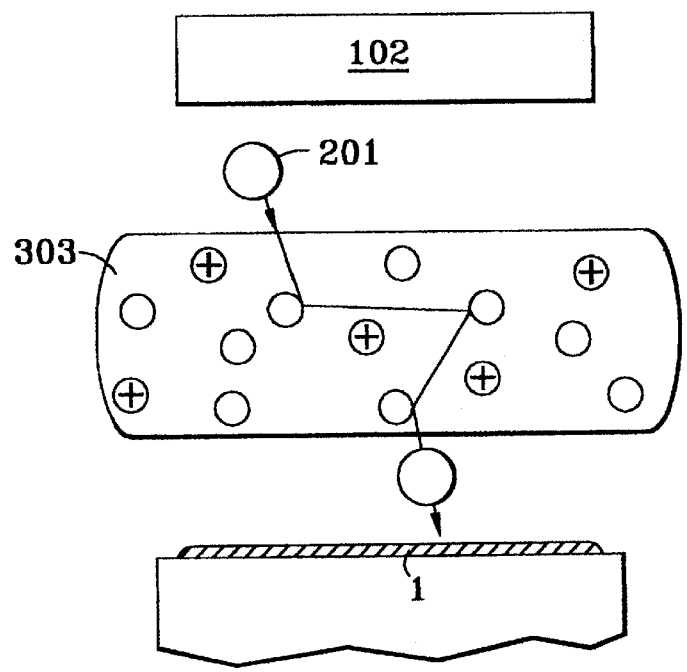
FIG. 3   PRIOR ART
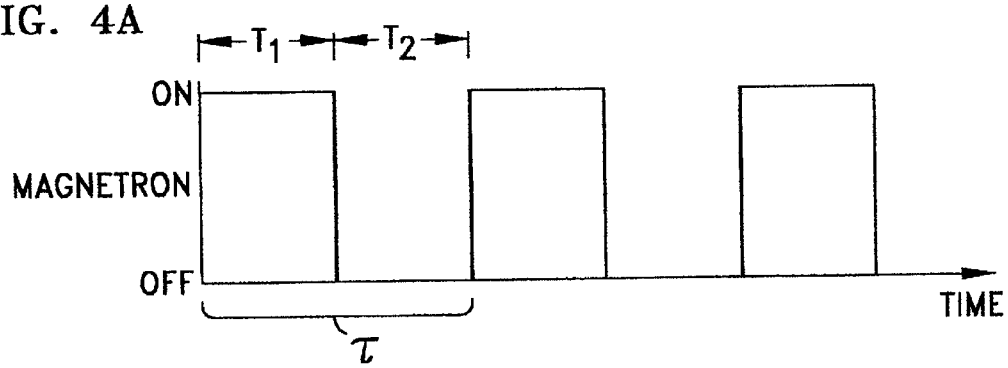
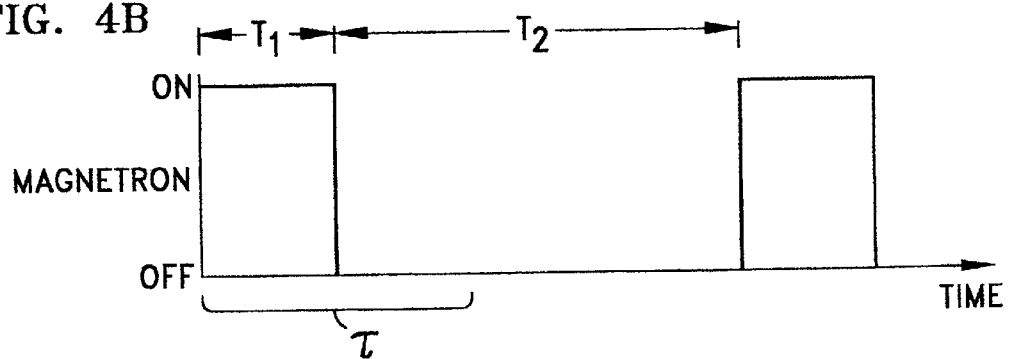

METHOD OF CONTROLLING GAS DENSITY IN AN IONIZED PHYSICAL VAPOR DEPOSITION APPARATUS

FIELD OF THE INVENTION

This invention relates to a method of controlling gas density to maintain a high level of ionization in ionized physical vapor deposition (IPVD) apparatus, which are widely used in the fabrication of semiconductor devices.

BACKGROUND OF THE INVENTION

Physical vapor deposition (PVD or sputtering) is a well-known process for depositing thin solid films on substrates, and is widely practiced in the semiconductor industry. Ionized physical vapor deposition (IPVD), also referred to as ionized metal plasma (IMP) deposition, has been used more recently to deposit metal films (notably copper) in etched structures such as vias and contact holes.

IPVD deposition apparatus differs from earlier versions of PVD apparatus in that a metal film is deposited on the substrate using a flux of ionized metal atoms. The metal atoms are ionized in a dense plasma generated in the process chamber. A typical IPVD apparatus is shown schematically in FIG. 1. The working gas in the process chamber 100 is typically an inert gas such as argon; the gas pressure is approximately 25 mTorr. During a deposition process, the working gas flows into the process chamber and is removed by a vacuum system (not shown). An RF coil (not shown) creates a plasma 103 in the working gas between a magnetron cathode 102 and the substrate 1. Metal atoms 101 are sputtered from the magnetron cathode 102; the atoms are ejected from the cathode with a kinetic energy of about 5 eV, and undergo ionizing collisions in the plasma 103. The result is that a flux of metal ions 104 crosses the gap between the plasma 103 and the substrate 1 (typically a silicon wafer), which has a negative bias with respect to the plasma.

Since the gas pressure is approximately 25 mTorr, the mean free path $\lambda$ of the metal atoms is approximately 1 to 2 cm. However, the mean free path for ionization $\lambda_i$ is approximately 30 to 40 cm. This means that multiple collisions in the plasma are required to produce a useful degree of ionization. FIG. 2 illustrates a dense plasma 103 in which a metal atom 201 (sputtered from the magnetron cathode 102) undergoes many collisions with both neutral and ionized gas atoms, so that a metal ion 204 is produced.

The kinetic energy of the metal atoms is deposited in the working gas and the plasma. This leads to a problem as the magnetron power level is increased, thereby increasing the flux of metal atoms entering the plasma. Heating of the working gas and plasma by the metal atoms causes the working gas and plasma to rarefy, so that fewer collisions occur; the result is a lower probability of ionization of the metal atoms. This situation is illustrated in FIG. 3. Plasma 303 is hotter and therefore less dense than plasma 103, so that metal atom 201 experiences only a few collisions and traverses the plasma without being ionized.

In general, as the IPVD process is scaled up to higher magnetron power levels, the degree of ionization of the metal atoms decreases and the advantage of the IPVD process (that is, depositing metal films from ions rather than neutrals) also decreases.

SUMMARY OF THE INVENTION

The present invention addresses the above-described need by providing a method for maintaining a high gas and plasma density in an IPVD device.

The problem of gas rarefaction resulting from magnetron sputtering in IPVD may be avoided by operating the magnetron in a pulsed fashion, rather than in a steady state, during the deposition process. This permits collisions to occur between metal atoms and the gas while the gas is still cold.

In accordance with the present invention, a method for controlling plasma density in an IPVD device is provided which includes the steps of: powering the magnetron during a first time period to produce a flux of atoms which heat the gas; depowering the magnetron during a second time period; and flowing the gas through the device during the powering step and the depowering step. The flow of gas through the device is characterized by a residence time, and the powering and depowering steps are performed in accordance therewith, so as to prevent rarefaction of the gas by heating thereof due to the flux of atoms.

If the residence time is given as $\tau$, and the first time period and the second time period are substantially equal, the operation of the magnetron may be characterized by a frequency of $1/\tau$. The second time period may be greater than the first time period.

BRIEF DESCRIPTION OF THE DRAWINGS

FIG. 3 is a schematic view of an IPVD process in which the plasma is less dense than that shown in FIG. 2, so that a sputtered metal atom is not ionized.

FIGS. 4A and 4B are timing charts illustrating pulsed operation of a magnetron in an IPVD device, in accordance with the present invention.

DETAILED DESCRIPTION OF THE PREFERRED EMBODIMENTS

As noted above, the working gas flows through the process chamber and is removed by the vacuum system throughout the deposition process. The time constant $\tau$ or residence time for a typical gas atom in the process chamber is in the range 0.01 to 0.1 second. In accordance with the present invention, the magnetron power is pulsed at a frequency consistent with $\tau$. This permits the working gas to cool between pulses, so that the plasma density is maintained at a high (unrarefied) level.

For example, if $\tau \approx 0.1$ sec, the magnetron power supply may be operated at 10 Hz (that is, ON from t=0 to 0.05 sec, OFF from t=0.05 sec to 0.1 sec). During the time the magnetron is on (t=0 to t=0.05 sec), the flux of sputtered metal atoms enters the working gas plasma and heats the working gas. However, the flow of working gas through the process chamber is maintained in a steady state; replacement of the heated gas with fresh, cold gas thus begins immediately and continues while the magnetron is off (t=0.05 sec to 0.1 sec). By t=0.1 sec$\approx \tau$, the majority of the working gas originally present in the process chamber will have been removed. At the beginning of the next magnetron power cycle (t=0.1 sec), a cold, dense gas and plasma will again be present in the process chamber.

Operating the magnetron in a pulsed fashion thus avoids a steady-state heat buildup in the working gas due to the flux of metal atoms, so that the problem of gas rarefaction and decreased ionization efficiency of the plasma is likewise avoided.

In this example, the ON and OFF periods of the magnetron are equal, but it will be appreciated that a different duty cycle may be used if desired. For example, the OFF period may be extended to further ensure that all of the heated working gas is removed from the process chamber and replaced with fresh, cold gas before the magnetron is again turned on. FIG. 4A illustrates operation of the magnetron at a frequency $1/\tau$; the ON period is given as $T_1$ and the OFF period is given as $T_2$, with $T_1=T_2$. FIG. 4B illustrates operation of the magnetron with an extended OFF period, so that $T_2>T_1$. As shown in FIGS. 4A and 4B, the total cycle time, $T_1+T_2$, should be greater than or equal to $\tau$. When the magnetron is pulsed at the highest frequency consistent with $\tau$, $T_1$ and $T_2$ are both equal to $\tau/2$ (see FIG. 4A).

Figure 1:
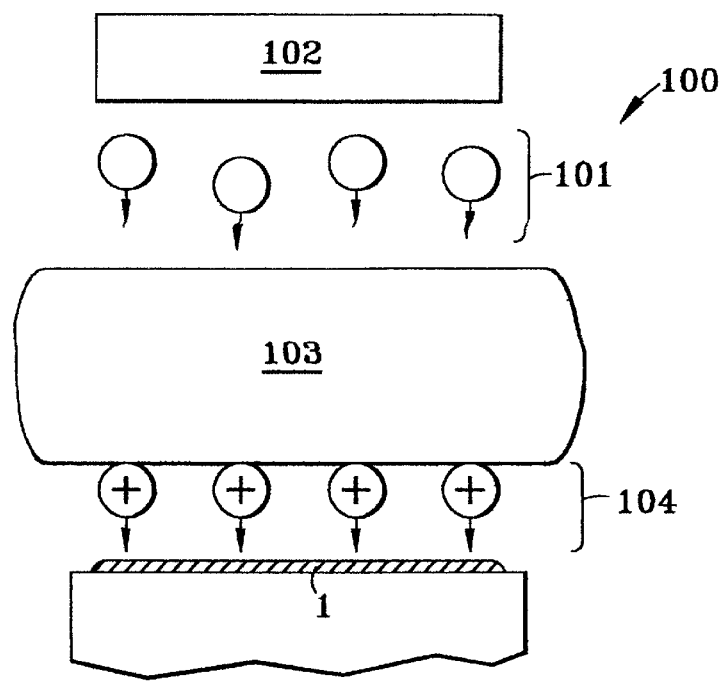
FIG. 1 is a schematic view of a typical ionized physical vapor deposition (IPVD) apparatus.
Figure 2:
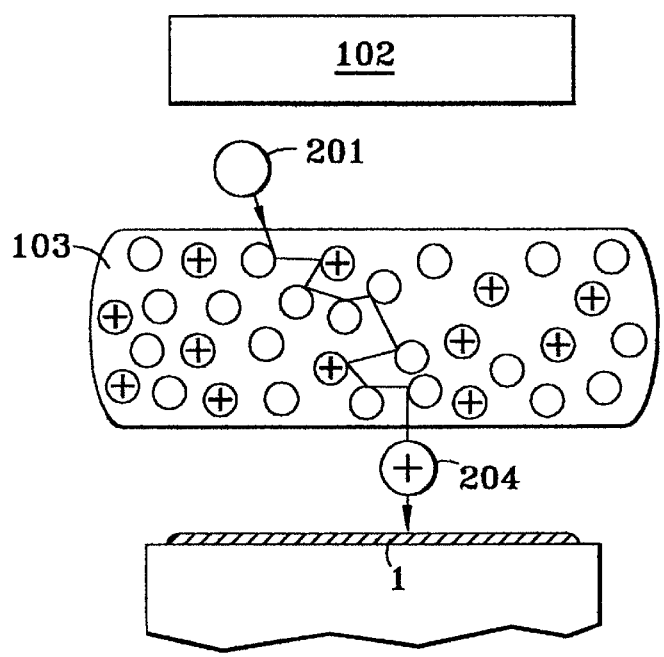
FIG. 2 is a schematic view of an IPVD process in which the plasma is sufficiently dense to cause ionization of the sputtered metal atoms.
Figure 5:
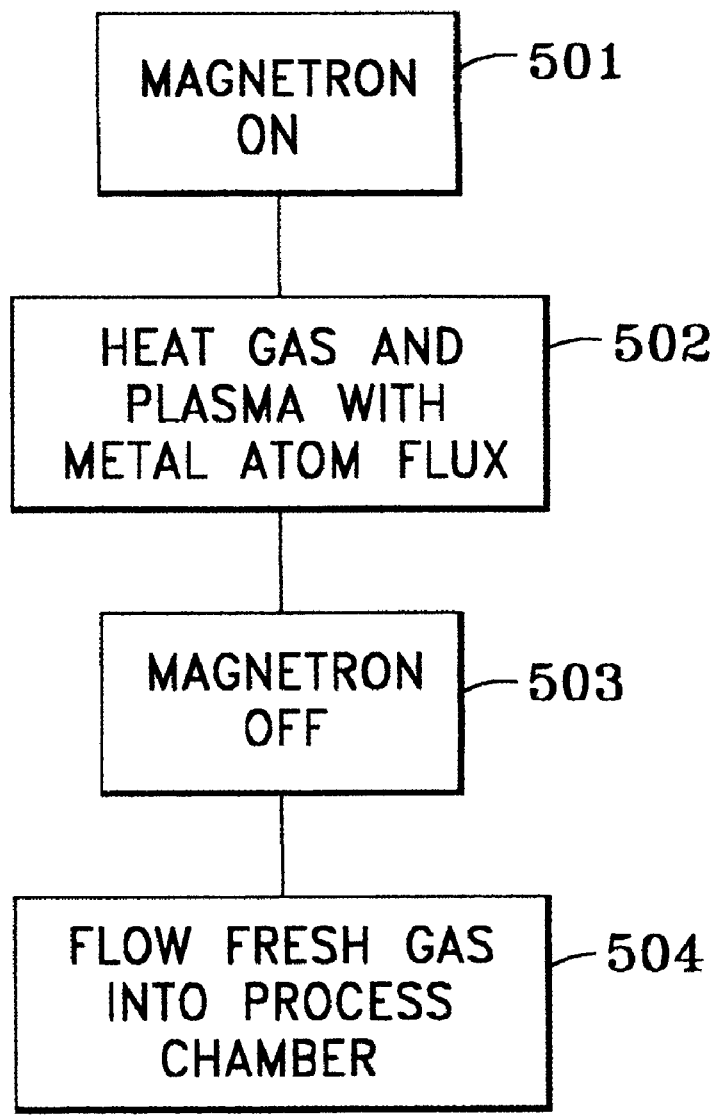
FIG. 5 is a flowchart illustrating steps in a method for maintaining high-density gas and plasma in an IPVD deposition process, in accordance with the present invention.

The magnetron power cycle is diagrammed in the flowchart of FIG. 5. At the beginning of the cycle the magnetron is turned on (step 501), which results in a flux of metal atoms heating the gas and plasma (step 502). The magnetron is turned off (step 503), and fresh working gas is introduced into the process chamber (step 504) before the magnetron is powered again.

It will be appreciated that the time constant for maintaining the plasma (generally on the order of microseconds) is much shorter than $\tau$. Accordingly, the RF power supply may be energized throughout the process, or alternatively may be cycled on and off consistent with the cycling of the magnetron power supply, so that a plasma is present only while the magnetron cathode is powered.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

I claim:

1. A method for controlling gas density in an ionized physical vapor deposition (IPVD) device wherein atoms are sputtered from a magnetron cathode and ionized in a plasma, the plasma being formed in the gas, the method comprising the steps of:

flowing the gas through the device, powering the magnetron during a first time period $T_1$ to produce a flux of atoms, heat the gas with said flux of atoms, depowering the magnetron during a second time period $T_2$, cooling the gas resident in the device by the continued flow of gas through the device, wherein the flow of gas through the device is characterized by a residence time $\tau$, and $T_1+T_7 \geq \tau$, and said powering and depowering steps are performed in accordance with the residence time, so as to prevent rarefaction of the gas by heating thereof due to the flux of atoms.

2. A method according to claim 1, wherein the first time period and the second time period are substantially equal, and operation of the magnetron is characterize by a frequency of $1/\tau$.

3. A method according to claim 1, wherein the second time period is greater than the first time period.

4. A method according to claim 1, wherein $T_1 \geq \tau/2$.

5. A method according to claim 1, wherein the IPVD device includes an RF power source for maintaining the plasma, and further comprising the steps of:

energizing the RF power source during the step of powering the magnetron; and de-energizing the RF power source during the step of depowering the magnetron, so that the plasma is maintained while the magnetron is powered.

* * * * *